(12) United States Patent
Smallhorn

(10) Patent No.: US 6,585,189 B1
(45) Date of Patent: Jul. 1, 2003

(54) UNDER FLOOR AIR COOLED HOUSING SYSTEM FOR AIRCRAFT PASSENGER SYSTEM ELECTRICAL BOXES AND THE LIKE

(75) Inventor: George R. Smallhorn, Montreal (CA)

(73) Assignee: Inflight Canada Inc., Quebec (CA)

( * ) Notice: Subject to any disclaimer, the term of this patent is extended or adjusted under 35 U.S.C. 154(b) by 0 days.

(21) Appl. No.: 10/166,091

(22) Filed: Jun. 11, 2002

Related U.S. Application Data

(63) Continuation-in-part of application No. 10/021,206, filed on Dec. 7, 2001.

(51) Int. Cl.$^7$ ................................................. B64C 1/00
(52) U.S. Cl. ..................................... 244/118.5; 244/119
(58) Field of Search ........................ 244/117 R, 118.1, 244/118.2, 118.5, 118.6, 129.4, 129.2, 163; 456/71, 72, 73, 74, 76

(56) References Cited

U.S. PATENT DOCUMENTS

| | | | | |
|---|---|---|---|---|
| 5,479,983 A | * | 1/1996 | Fischer et al. | 165/205 |
| 5,516,330 A | * | 5/1996 | Dechow et al. | 454/74 |
| 5,927,030 A | * | 7/1999 | Petit et al. | 52/220.1 |
| 5,973,722 A | | 10/1999 | Wakai et al. | |
| 5,984,415 A | * | 11/1999 | Schumacher et al. | 297/411.2 |
| 6,058,288 A | * | 5/2000 | Reed et al. | 455/3.06 |
| 6,177,887 B1 | * | 1/2001 | Jerome | 725/76 |
| 6,194,853 B1 | * | 2/2001 | Tual et al. | 318/266 |
| 6,290,518 B1 | * | 9/2001 | Byrne | 439/131 |
| 6,513,756 B1 | * | 2/2003 | Lambiaso | 244/119 |
| 6,527,566 B1 | * | 3/2003 | Lambiaso | 439/131 |
| 2001/0042612 A1 | | 11/2001 | Hasenoehrl et al. | |

FOREIGN PATENT DOCUMENTS

| | | |
|---|---|---|
| EP | 96106450 | 10/1996 |

* cited by examiner

*Primary Examiner*—Charles T. Jordan
*Assistant Examiner*—Stephen A Holzen
(74) *Attorney, Agent, or Firm*—Paul J. Field

(57) ABSTRACT

An under floor housing system for a plurality of passenger seat electronic units within an aircraft, the aircraft including a passenger cabin with a floor supporting a plurality of passenger seats, the passenger cabin having an air circulation system; the individual passenger seat electronic units each being connected to a master control and communicating via at least one conduit to a passenger interface accessible from an associated passenger seat, the units and interface capable of providing passenger services selected from the group consisting of: audio entertainment; video entertainment; telephone; intercom; television; video games; internet; email; and electrical power supply, the under floor housing system comprising: at least one housing recessed beneath the floor surface adjacent the passenger seats, each housing having: a removable top cover; side walls; and a bottom wall defining an interior compartment; and air cooling means, for cooling each electronic unit within the interior compartment of each housing, the air cooling means comprising a fan with an intake and outlet in communication with the passenger cabin air circulation system.

17 Claims, 13 Drawing Sheets

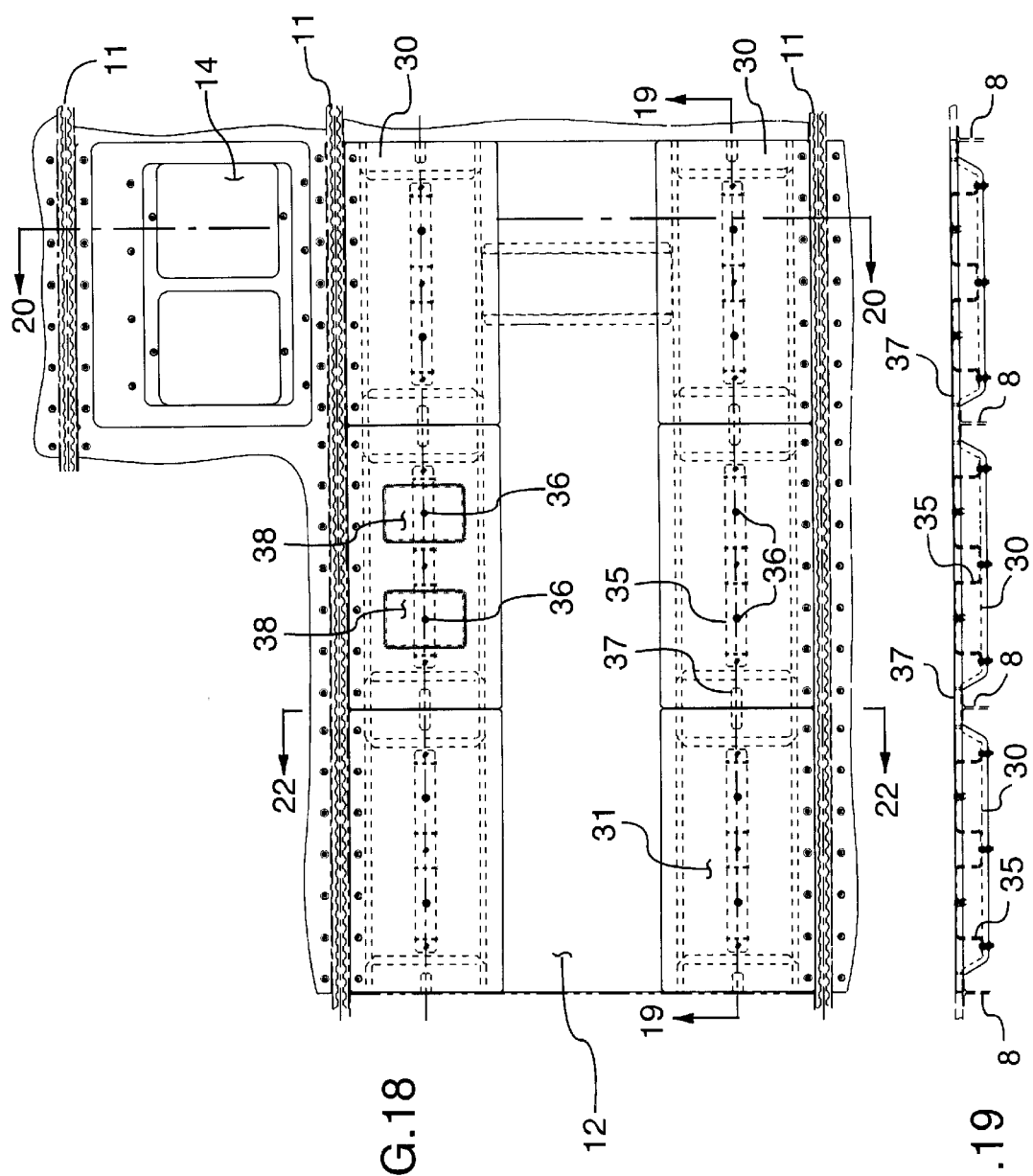

UNDER FLOOR AIR COOLED HOUSING SYSTEM FOR AIRCRAFT PASSENGER SYSTEM ELECTRICAL BOXES AND THE LIKE

This is a Continuation-in-part of Ser. No. 10/021,206, filed Dec. 7, 2001.

TECHNICAL FIELD

The invention relates to an under floor air cooled housing system, for aircraft electrical devices for passenger use such as passenger seat electronics units (SEU) or digital system entertainment boxes, in particular a housing system for retrofit relocation of existing devices from under passenger seats to an air cooled protective under floor housing for improved duty life and easy access for servicing with floor mounted cables relocated in raceways within the floor panels or under the floor boards.

BACKGROUND OF THE ART

The passenger cabins of aircraft are intended to provide maximum safety and comfort for passengers. An increasingly important component is the provision of passenger entertainment systems, mobile telephone services, laptop power and computer communications connectivity. Passengers are normally required to remain seated for extended periods and for optimum safety, the passengers should remain seated with safety belt fastened during a flight. To improve service, airlines plan to provide audio and video entertainment, telephone, intercom, television, video games, internet, email and electrical power supply for laptop computers, especially in business class and first class areas to permit passengers to work during the flight, communicate or seek entertainment.

The airlines have responded to passenger's expectations and attempted to improve passenger service by providing such entertainment and communication services in existing aircraft and in new aircraft as they are purchased. Due to the confines of existing aircraft cabins and seating arrangements, it has been considered necessary to fit passenger seat units with entertainment and communication system electrical boxes or other passenger systems electrical boxes that are currently mounted to the seat legs under the seat. A conventional aircraft passenger seat is supported in single, two to five multiple seat units on a metal frame with legs that are secured within a seat track that can be adjusted for different seating pitch dimensions. Beneath the passenger seat, the area provided for carry on luggage has been reduced by the installation of passenger entertainment and communication system electrical boxes and other system's boxes. Conventional system electrical boxes are approximately the size of a shoe box and can usually serve up to three separate passenger seats from a single unit located under one of the seats within the area originally provided for carry-on hand luggage.

The conventional location of these bulky digital system electrical boxes or other system's boxes in the under seat hand luggage area has several disadvantages. Apart from reducing the area within the passenger cabin for hand luggage and the passenger's feet, the installation of electrical equipment near passengers subjects the passenger to a risk of injury and potential electrical shock, as well as exposing the electrical equipment to potential accidental impact damage, vandalism, foreign matter ingestion into cooling fans and spilled beverages served within the passenger cabin. Since many such boxes are powered by 115 volt power, the risk of electrical shock or fire is significant. The electrical boxes interfere with cleaning of the passenger cabin and electronic units are exposed to potential damage from vacuum cleaners and cleaning solvents used during the cleaning of carpets and passenger seats.

The conventional location under the passenger seats also prevents the reduction in the quantity of such boxes that are required per aircraft. The location limits the size of boxes and routing of cables to multiple seats from a single box. In practical terms, conventional placement of boxes under passenger seats has limited the number of seats that can be served by a single box to three since a larger boxes would be needed for serving four or more seats.

The conventional under seat location also makes maintenance and inspection very difficult. For example, replacing an under seat system electrical box takes approximately one hour due to its inconvenient location. All electrical equipment generates heat and in order to extend the duty service life of electrical equipment, temperature control and air cooling is generally preferred. However, when electrical equipment is located under the seat of a passenger cabin, use of cooling fans is disadvantageous due to the noise level generated and risk of accidental contact. In addition, close proximity to a floor in a high traffic area with carpets and upholstery generates significant amounts of lint and dust that is sucked into air cooled electrical equipment by fans thereby requiring frequent cleaning. Often, cleaning does not occur and the electrical units become clogged with dirt and lint, overheat and fail. Despite the risks and added noise, typically small cooling fans are provided but under seat electrical components remain inadequately protected from damage and are poorly cooled with dusty air resulting in a significantly decreased service life.

Reduction in the exposure to potential damage, provision of adequate cooling and reduction of the number of boxes can result in significant savings for airline operators. For example, since many electronic entertainment unit boxes can cost up to $10,000 US each, and wide bodied aircraft may require over 100 units, the potential for savings in reducing the number purchased and improved maintenance are obvious.

Therefore, at best the current configuration of system electrical boxes in aircraft passenger cabins is a make shift attempt to provide an increased level of passenger services at minimum cost and minimal disruption to the passenger cabin environment. However, as a long-term solution, the provision of relatively large electrical boxes under the seats of passenger cabins suffers from several disadvantages. As demand for increased passenger entertainment, communication and work related services appears inevitable, the number and complexity of such passenger service electronics boxes will increase dramatically.

It is an object of the present invention to rationalize the configuration of passenger service electronics within the passenger cabin and stow such electrical components safely in an isolated environment away from all accidental and intentional interference from the passenger, carry-on luggage, as well as food and beverages served within the cabin.

It is a further object of the invention to provide adequate temperate control and cooling for the passenger seat electronic boxes within a clean controlled environment to extend the duty service life of electrical components.

It is a further object of the invention to minimize the expense and down time required to modify existing aircraft equipment by retrofitting existing airlines cabins and relocating existing passenger electronic components without requiring extensive modification to the aircraft or requiring the aircraft to be out of service for extended periods of time.

It is a further object of the invention to provide temperature control and monitoring for passenger seat electronic boxes utilising the existing passenger cabin air circulation and air conditioning system without requiring the expense and added weight of a separate dedicated cooling system.

It is a further object of the invention to enable use of larger electrical service boxes capable of serving a higher number of passenger seats, thus reducing the quantity of boxes needed per aircraft and reducing the total electrical power draw.

It is a further object of the invention to integrate power cables, and other cables into hidden raceways within floor panels or suspended under the removable floor panels of the passenger cabin floor.

Further objects of the invention will be apparent from review of the disclosure, drawings and description of the invention below.

DISCLOSURE OF THE INVENTION

The invention provides an under floor housing system for a passenger seat electronic units within an aircraft, where the aircraft typically includes a passenger cabin with a floor supporting the passenger seats and includes an air circulation system, temperature monitoring system, cooling fan rotation monitoring system and floor boards with integral cable raceways.

Conventionally such electronic units are shoebox sized metal boxes hung under the passenger seats where the location exposes electronics to damage, occupies valuable cabin space, and complicates access for servicing. The individual passenger seat electronic units are connected to a master control and units communicate via individual cables to a passenger interface accessible from an associated passenger seat. The units and interface are currently capable of or will soon be adapted for providing passenger services such as: audio entertainment; video entertainment; telephone; intercom; television; video games; internet access; email; and electrical power supply for laptop computers.

The under floor housing system has several individual housings, adjacent to the passenger seats, recessed beneath the floor surface level and above the cargo hold fire liner. Each housing has a removable top cover, side walls, and a bottom wall defining an interior compartment. A forced air cooling fan with temperature sensor and fan rotation sensor is provided for cooling each electronic unit within the interior compartment of each housing with an intake and outlet in communication with the passenger cabin air circulation system.

By providing a separate recessed housing beneath the floor surface, numerous advantages over the conventional under seat location for electronic passenger units are achieved.

The service life of electronic units is increased dramatically due to the control of temperature during operation. The cooling fans operate in conjunction with the air circulation flow within the fuselage which generally draws air from the passenger cabin to exit the cabin through louvers in the cabin side walls adjacent the floor and then proceeds in the lower lobe of the fuselage to vent about 50% and recirculate the remaining 50% with fresh compressed air from the engine compressors. Therefore the positioning of recessed housings, with air cooling fans under the floor, draws in spent air that has exited the cabin and does not increase the heat input into the cabin. As well, the air cooled under floor housings do not require a dedicated air supply nor separate air coolers since the air conditioning system of the cabin has sufficient capacity and directs air flow to the under floor area of the fuselage.

By clustering existing electronic units within the under floor recessed housing, the electronic units are more easily accessible for service, inspection and replacement by maintenance personnel. For example, in an under seat location replacement of a defective unit requires approximately one hour of maintenance personnel time whereas the increased accessibility and visibility of cluster units in the recessed under floor housing makes replacement of a defective unit a simple matter of releasing the defective unit from the housing and reconnecting within five to ten minutes. The under floor housing includes a positive latch and mounting brackets that permit quick release of the electronic units for servicing and a sure and positive electrical connection when installed. The risk of electrical arcing from improper installation or disengagement during vibration is eliminated by the positive and sure connection within the recessed housing. The enclosure of units within the housing with a secure locked top cover reduces the danger to passengers.

Compared with the conventional under seat location, the recessed under floor housing conserves valuable passenger cabin space for carry-on luggage and eliminates dangerous exposed wiring. The cabin area remains available for passenger needs and is less cluttered for security inspections, cleaning and maintenance. As well, passengers and electric powered components are separated thereby reducing the risk of passenger injury and damage to the equipment from passengers, their luggage or food and beverages served in the passenger cabin. Intentional vandalism by passengers is eliminated by hiding the electrical units in the under floor housing.

A significant advantage of the invention is the ability to relocate or retrofit existing electronic components in existing aircraft. The units can be removed from their current location under seats and relocated in an under floor cluster within the housing. No changes need to be introduced in the functional capabilities of existing electronic components. The cabling from master control to each unit in the housing and cabling from the units to the passenger seats is reinstalled due to the different lengths and configuration of cables.

Increased control over the temperature of the electrical system operation is provided by positive airflow through the under floor housings and temperature sensors. The sensors alert the cabin crew through displays on a control panel in the event of any malfunction.

Airlines can more easily add electronically delivered passenger services to relatively crowded economy sections of the cabin with far less units since bulky electronic components can be stored in the under floor air cooled housings rather than in conventional under seat locations. Economy cabins have less space available for storing additional electronics boxes under the seats that would create a lack of space for passenger's feet and carry on luggage.

A further less obvious advantage however is the ability to easily upgrade passenger electronic units by replacing existing system electrical boxes in existing aircraft as the technology evolves and passenger services increase. For example, currently four seat passenger seating arrays are served by two system electrical boxes since current system electrical boxes are only capable of serving one to three separate passenger seats. By clustering the passenger electronics in an under floor housing, new higher capacity equipment can be provided sufficient to serve four or more seats if desired, without much concern over the additional size of the new equipment since it is stored under the floor. Further in the future, the existing cluster of three or four separate system electrical boxes may be replaced by a rationalized system that uses a single power supply resulting in a much smaller combined unit and lower power draw. Further in the future, it may be possible to provide an entirely new electronic system, which includes its own power supply and modern board with PC card to serve twelve or more seats from a single unit. The improved access for maintenance and servicing in housings under the floor, and grouping of units in clusters will make future upgrades easier, less costly in terms of the quantity of units and quicker to implement thus reducing labour costs and downtime. An aircraft that is out of service for maintenance or equipment upgrading, is not earning revenue and a quick turnaround is critical in implementing any such system upgrade.

In addition, since it is necessary in a retrofit to remove and replace several floor panels, the invention can easily provide for a recessed cable raceway in floor panels or an under floor suspended raceway adjacent to the seat tracks to route conduits and cables to individual seats in a raceway. The advantage of an under floor or recessed raceway is that existing plastic seat track cover strips can be eliminated and the entire cabin floor can be provided with a flat flush carpeted surface. Existing seat track cover strips enclose cables beneath them and rise above the carpeted floor level as a result. Plastic seat track covers are sometimes referred to as "speed bumps" due to their appearance and impedance of pedestrian traffic. Use of a recessed cable raceway and flush carpeted floor over the cables and seat track removes a tripping hazard, simplifies cleaning of the floor surface, reduces maintenance of the floor surface and improves the visual appeal of the passenger cabin.

DESCRIPTION OF THE DRAWINGS

In order that the invention may be readily understood, one embodiment of the invention is illustrated by way of example in the accompanying drawings.

FIGS. 1–16 relate to a recessed cable raceway that is suitable where the floor panels are not required as a diaphragm structural member to reinforce the floor beams and joists, as in Boeing™ aircraft for example.

FIGS. 17–22 relate to an alternative under floor raceway arrangement where the floor panels are used as a diaphragm structural member to reinforce the floor beams and joists, as in Airbus™ aircraft for example. In this case, the ability to include of cutouts in the floor panels is more restrictive and in general, the high stress areas around the edges of the panels must remain intact for structural reasons limiting cutout openings to the central low stress area of the floor panels.

FIG. 17 is a sectional view also along line 3—3 of FIG. 2 indicating an alternative orientation of the passenger cabin and floor with seating arrangement not shown, but rather showing an alternative longitudinal dual raceway with recessed housings branching off laterally from the two central longitudinal raceways.

FIG. 18 is a detailed plan view of a selected typical portion of the cabin floor shown in dashed outline in FIG. 17.

FIG. 19 is a sectional view along lines 19—19 of FIG. 18 showing a section of the raceway.

FIG. 20 is a sectional view along lines 20—20 of FIG. 18 showing the two raceways and a recessed housing beneath a removable top cover in the passenger cabin floor.

FIG. 21 is a sectional detailed view of one third of the view shown in FIG. 19.

FIG. 22 is a sectional view along lines 22—22 of FIG. 19.

Further details of the invention and its advantages will be apparent from the detailed description included below.

DETAILED DESCRIPTION OF PREFERRED EMBODIMENTS

Figure 1:
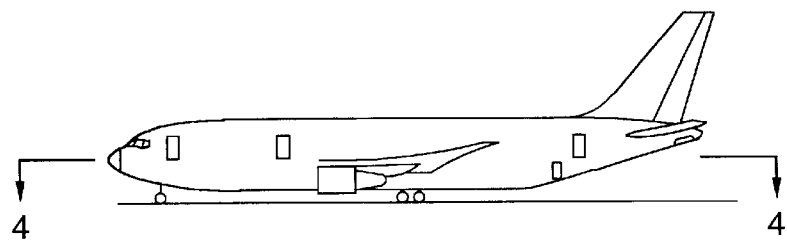
FIG. 1 shows a side view of a typical passenger aircraft to orient the following sectional views.
Figure 2:
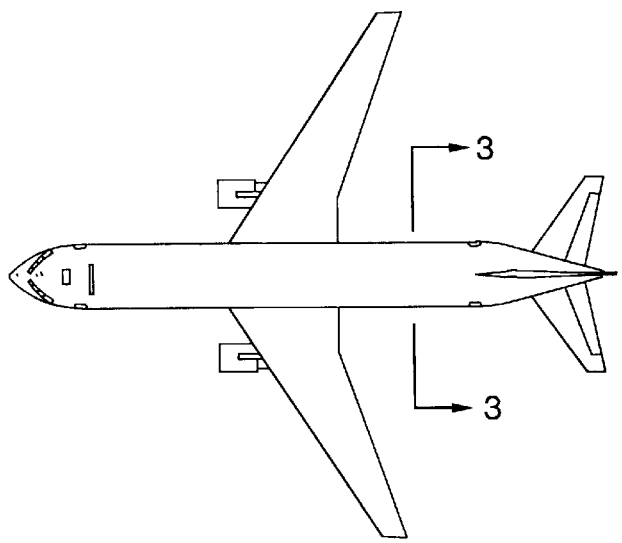
FIG. 2 shows a top plan view of the aircraft for the same reason.
Figure 3:
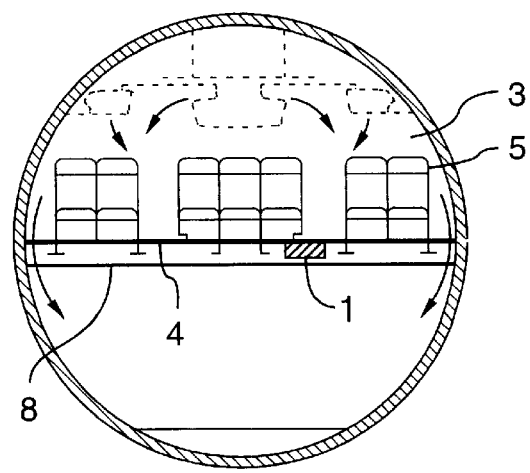
FIG. 3 shows a sectional view along line 3—3 of FIG. 2 indicating the orientation of the passenger cabin floor and a typical seating arrangement.
Figure 4:
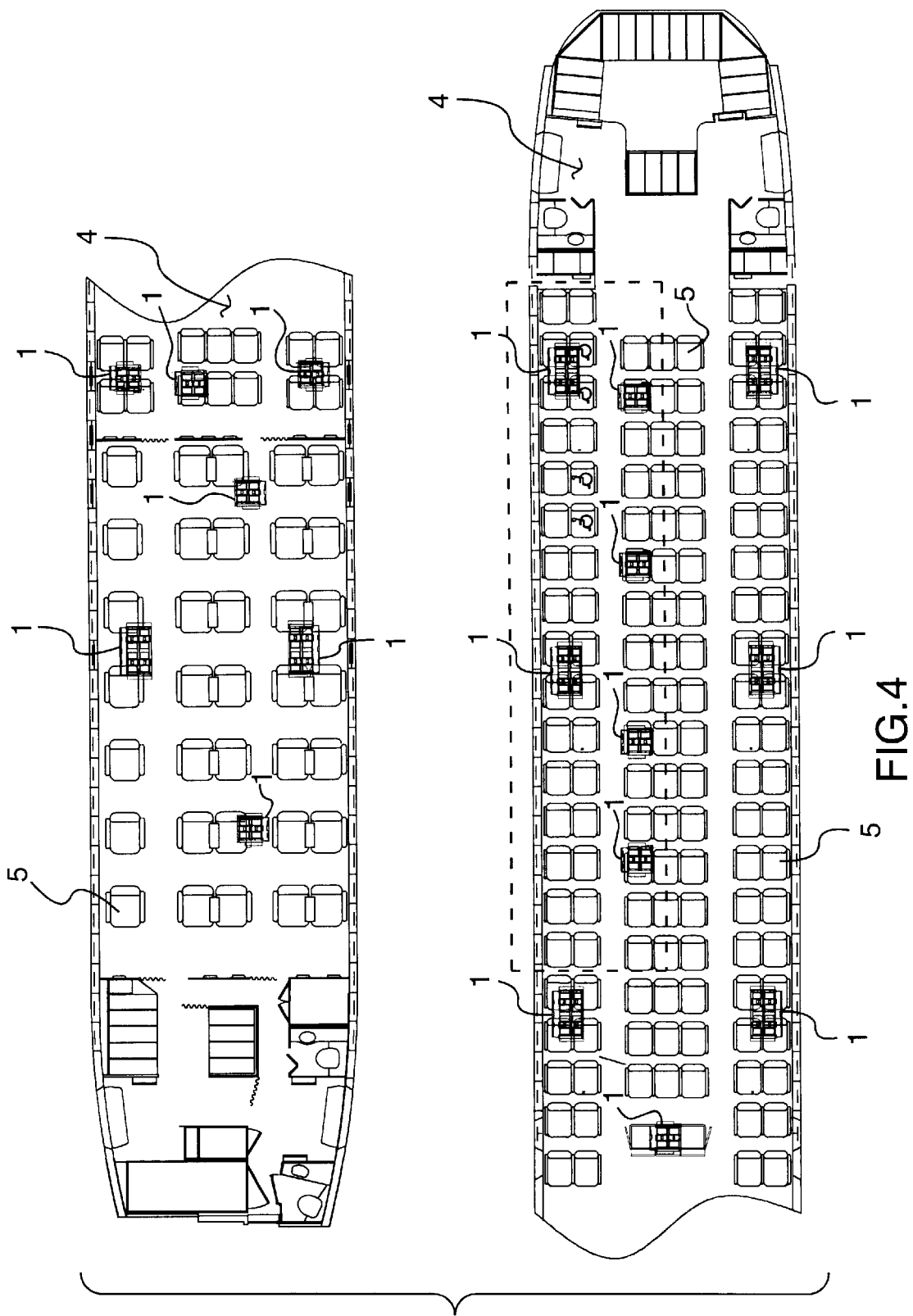
FIG. 4 is a sectional view along line 4—4 of FIG. 1 showing the passenger cabin floor plan and seating arrangement typically found in a wide body aircraft, and in particular showing the location of various under floor recessed housings providing air cooled accommodation for clusters of existing passenger electronic units that are relocated from their conventional under seat location to their under floor air cooled housing.

As mentioned above, FIGS. 1 and 2 are provided to orient the reader in quickly understanding the sectional view FIG. 3 and the floor plan of FIG. 4. A conventional aircraft passenger cabin floor 4, as indicated in FIG. 3, is supported on transverse floor beams 8 that in turn support longitudinal floor joists 10 with seat tracks 11 in their top flanges wherein seat legs can slide longitudinally and are locked in various seat pitch patterns as desired.

Pressurized air for the passenger cabin 3 comes from compressor stages in the aircraft engines. A portion of the hot compressed air is drawn off from the engine and passed through heat exchangers, then further cooled by air conditioning units under the floor 4 of the cabin 3. Cooled air flows into a mixing chamber where it is mixed with an approximately equal amount of filtered air from the passenger cabin, then ducted and distributed via overhead louver outlets. Within the cabin 3, the airflow is generally circular and exits through floor grills on either side of the cabin 3 into the lower cargo portion of the fuselage. Generally, one half of the air from the cabin is exhausted through an overflow valve, which also controls cabin pressure and provides air changeover. The other half of the air is filtered and mixed with incoming compressed air from the engine. As shown in FIG. 3, the positioning of the under floor recessed housing 1 utilizes spent air flow that has exited from the cabin 3. Any heat exchanged to the air used for cooling the housing 1 is not directed towards passengers but rather is directed to the air makeup/exhaust/reconditioning portion of the conventional aircraft air circulation system.

Figure 5:
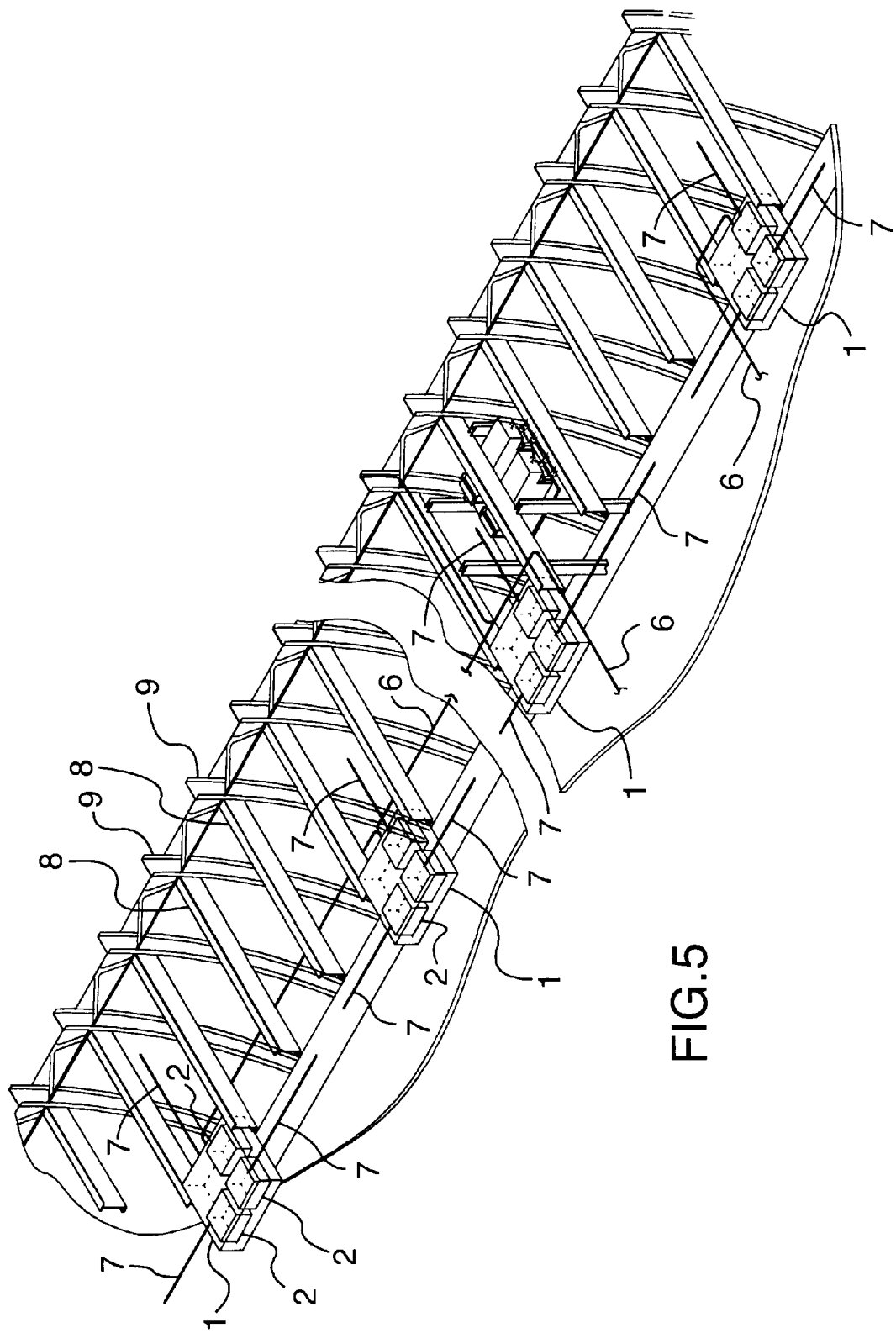
FIG. 5 is a partial perspective view of the aircraft floor structure with floor panels removed to show transverse floor beams and in particular to show an example of four individual under floor housings each including three individual passenger electronic units, with additional space for a fourth electronic unit. It will be understood that floor housings for larger aircraft such as a Boeing 767™ may contain more than four units per housing and the illustrated embodiments serve as examples only. The particular seat layout of any aircraft with differing dimensions and seat arrangements in cabin sections (first class, business class, economy etc.) will influence the selection of the most economical and practical design layout for under floor housings and raceways.
Figure 6:
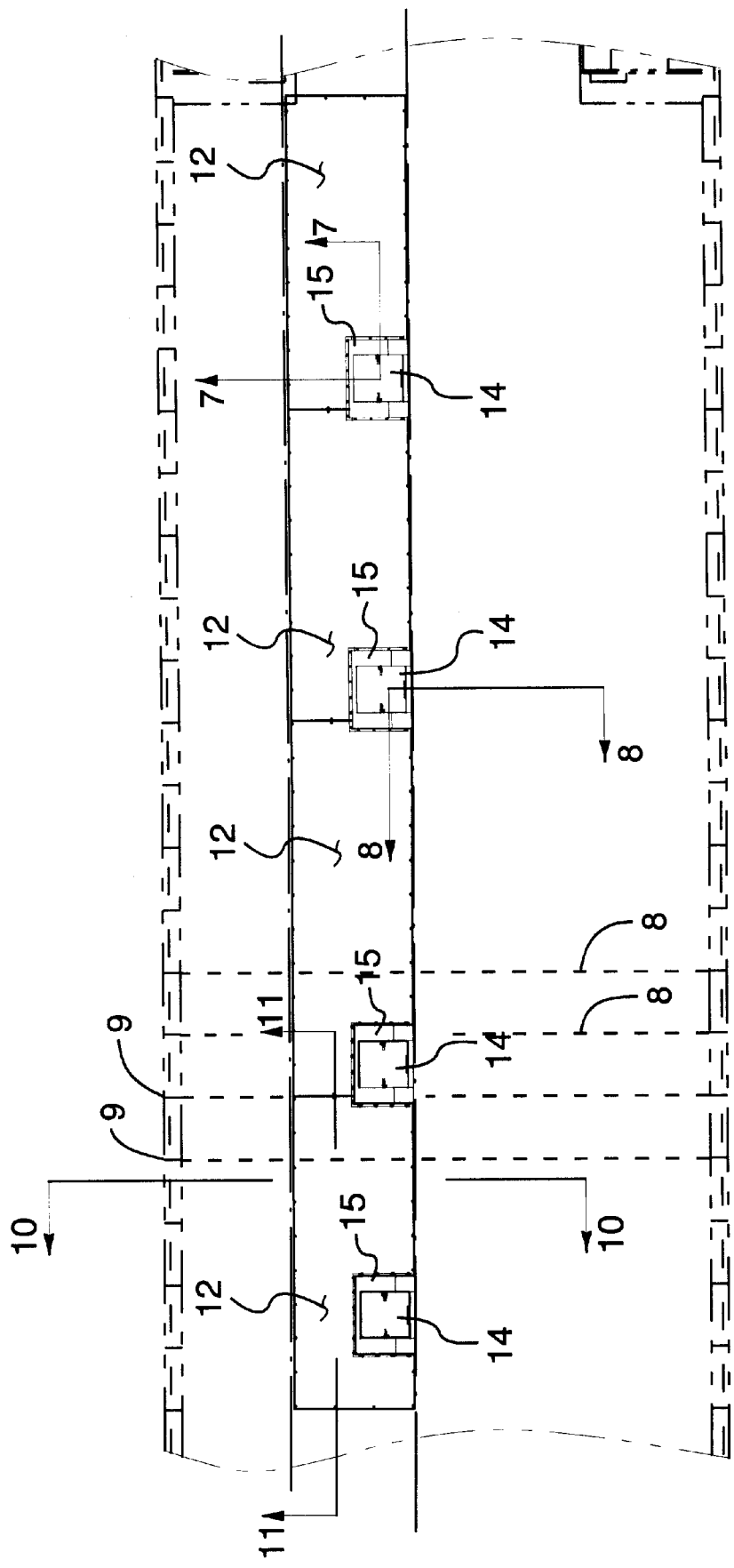
FIG. 6 is plan view of a portion of the passenger cabin floor (as in FIG. 5) with modified floor panels, removable top cover on four under floor housings and access cover frames surrounding the removable cover to support it on the existing transverse beams and provide support for adjacent floor panels.

FIG. 4 shows a floor plan of a conventional wide body aircraft with different seat arrangements in the forward first class/business class forward portion and closer seat pitch in the rearward economy class area. In both cases, individual passenger seat electronic units have been removed from their conventional locations under the seat units and relocated in clusters in recessed under floor housings 1. For simplicity of the description, FIGS. 5 and 6 show only a small portion of the cabin floor that includes four individual recessed housings 1 in the area indicated in FIG. 4 with dashed outline.

Therefore, according to the invention the under floor housing system provides for new installation or for relocation and replacement of existing or new passenger seat electronic units 2 within the aircraft. In general, the aircraft includes a passenger cabin 3 with a floor structure 4 supporting an array of passenger seats 5 either in individual units, or two to five seats 5 in a row array. Each individual seat unit or multiple seat unit has seat legs secured within the seat tracks 11 longitudinally extending throughout the aircraft cabin floor 4.

The individual passenger seat electronic units 2 are each connected to the aircraft master control via conduit 6 (shown in FIG. 5) and units 2 communicate via cables 7 (shown in FIGS. 5, 15 and 16) through a passenger interface accessible from an associated passenger seat 5.

As mentioned above, the passenger seat electronic units 2, such as digital system electronic boxes, currently provide or in the future will provide a variety of passenger services such as audio entertainment, video entertainment, mobile telephone and intercom voice communication, television, video games, internet, email, and electrical power supply for laptop computers and the like.

According to the invention, the under floor housing system includes a number of individual air cooled housings 1 recessed beneath the floor surface 4 adjacent to the passenger seats 5 for example as shown in FIG. 4.

As indicated in FIGS. 5, 10, 11, 15 and 16, the floor 4 is built up from a series of spaced apart transverse floor beams 8 that span across oval hoops 9 to form the structural frame work for the aircraft fuselage. The floor beam 8 arrangement is best seen in the FIG. 5 perspective view. As also shown in the perspective view of FIG. 15, the extruded aluminium alloy transverse beams 8 in turn support longitudinal joists 10 that are extruded aluminium sections including a seat track 11 in the top flange of the joist 10. The top flange of the beams 8 and joists 10 are assembled in a common plane to provide a flat rectangular grillwork into which individual floor panels 12 are removably secured with countersunk bolts 13 (as best seen for example in the sectional views of FIGS. 10 and 11).

FIG. 6 shows retrofit installation of four air cooled recessed housings 1 in an example arrangement where the original rectangular floor board units are removed. Floor boards are replaced with floor panels 12 that have custom rectangular cut outs to accommodate the recessed housing 1 and the associated access cover frame 15 surrounding the removable top cover 14, the details of which are described below.

Therefore where existing system electrical boxes 2 or other passenger electronics components are to be relocated in the under floor cluster within the recessed housing 1, signals and power are provided to the system electrical boxes 2 from the master control via cables 6 and new cables 7 are installed through recessed raceways 30 (see FIGS. 15, 16) between the recessed housing 1 and each individual passenger seat 5.

Figure 7:
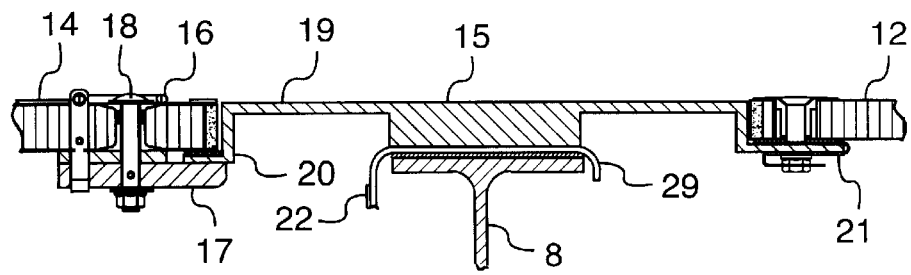
FIG. 7 is a sectional view through the removable cover, rotatable locking plate and adjacent portion of the access cover frame. The rotating locking plate design is shown as an example only and in all cases a design that requires no tools for access is preferred.
Figure 8:
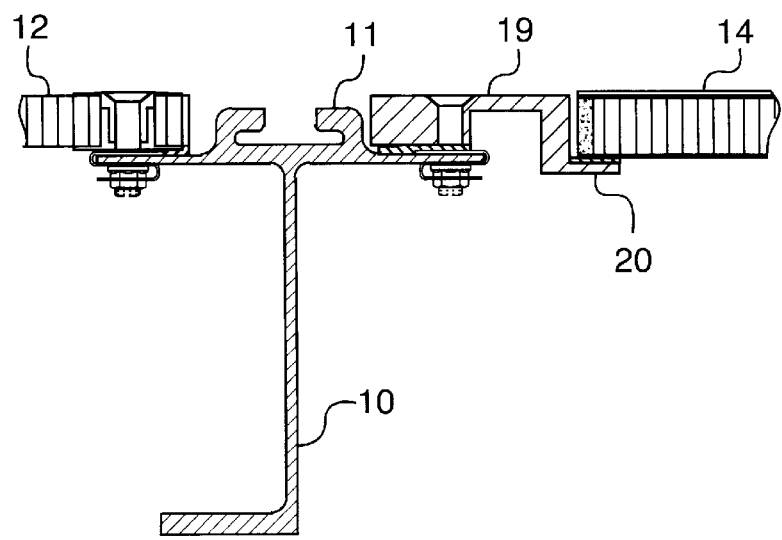
FIG. 8 is a sectional view through the joist with top flange seat track, portion of the access cover frame supporting the cover.
Figure 9:
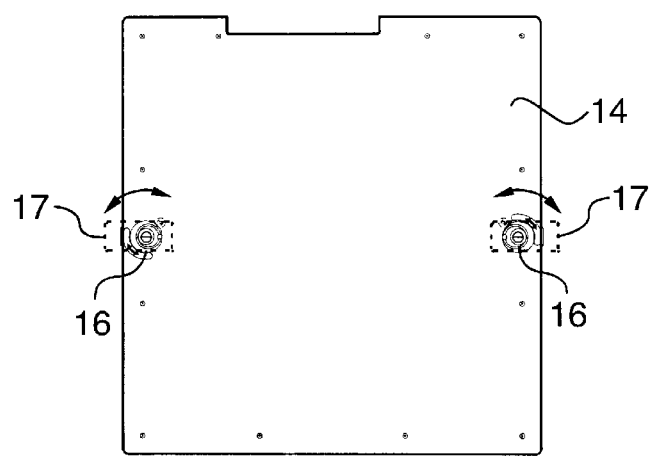
FIG. 9 is a plan view of the removable cover for the recessed housing, showing two rotatable locking plate mechanisms that hold the cover within the access cover frame as seen in the left portion of FIG. 7.
Figure 10:
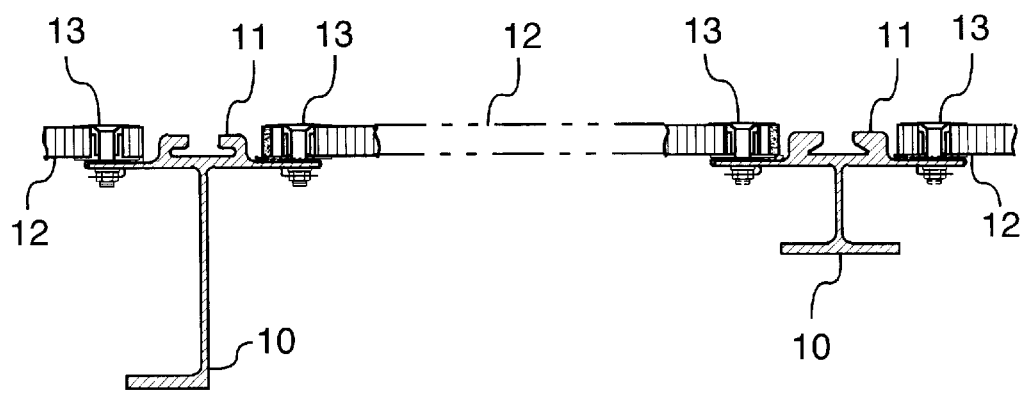
FIG. 10 is a sectional view, along line 10—10 of FIG. 6, showing a section view through the floor panel, which is bolted to the top flange of the adjacent longitudinal floor joist with removable countersunk bolts.
Figure 11:
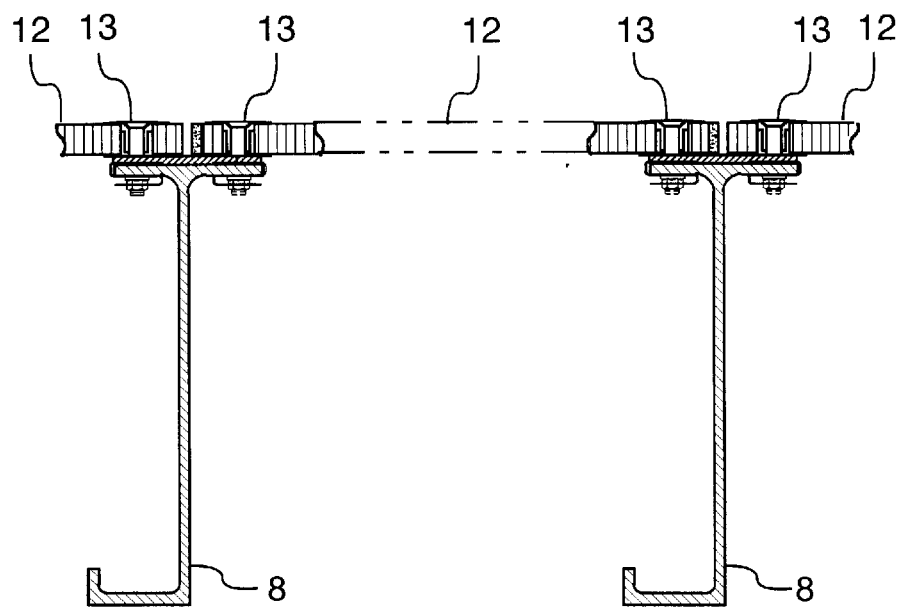
FIG. 11 is a like sectional view, along section lines 11—11 of FIG. 6, showing sectional view through the floor panel bolted to top flange of two adjacent transverse floor beams. It will be apparent that the floor beams and joists need never be altered since all floor panel modifications use existing bolt holes and under floor housings are hung from unaltered beam flanges. Any modification to the beams or joists (drilling, welding or added bolts etc.) would impede acceptance of the system described herein since any alterations to the airframe structure undergo close design scrutiny for safety and equipment duty life issues.

FIGS. 7, 8 and 9 show the detailed construction of the top cover 14 and surrounding cover frame 15. The cover plate 14 includes two lifting rings 16 and a quarter turn locking mechanism with lock plate 17 that is rotated 90° or one quarter turn with the bolt 18. The access cover frame 15 has peripheral plates 19 that surround and define the cover opening with a recessed lip 20. The adjacent floor panels 12 are supported on a recessed floor panel support plate 21. The rotating locking plate design is shown as an example only and in all cases a design that requires no tools for access is preferred. The cover 14, frame 15 and locking mechanism 17 may be altered without departing from the scope of the invention.

Figure 12:
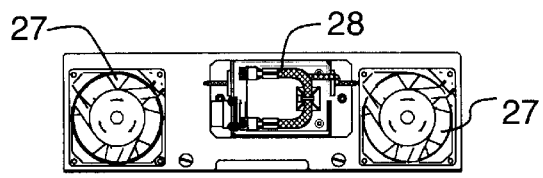
FIG. 12 is a sectional view along line 12—12 of FIG. 13 showing the interior view of the dual fan unit with temperature sensor positioned between the two axial flow fans. For larger clusters o f equipment with more units or larger units, air flow may be increased by providing larger fans or additional fan units.
Figure 13:
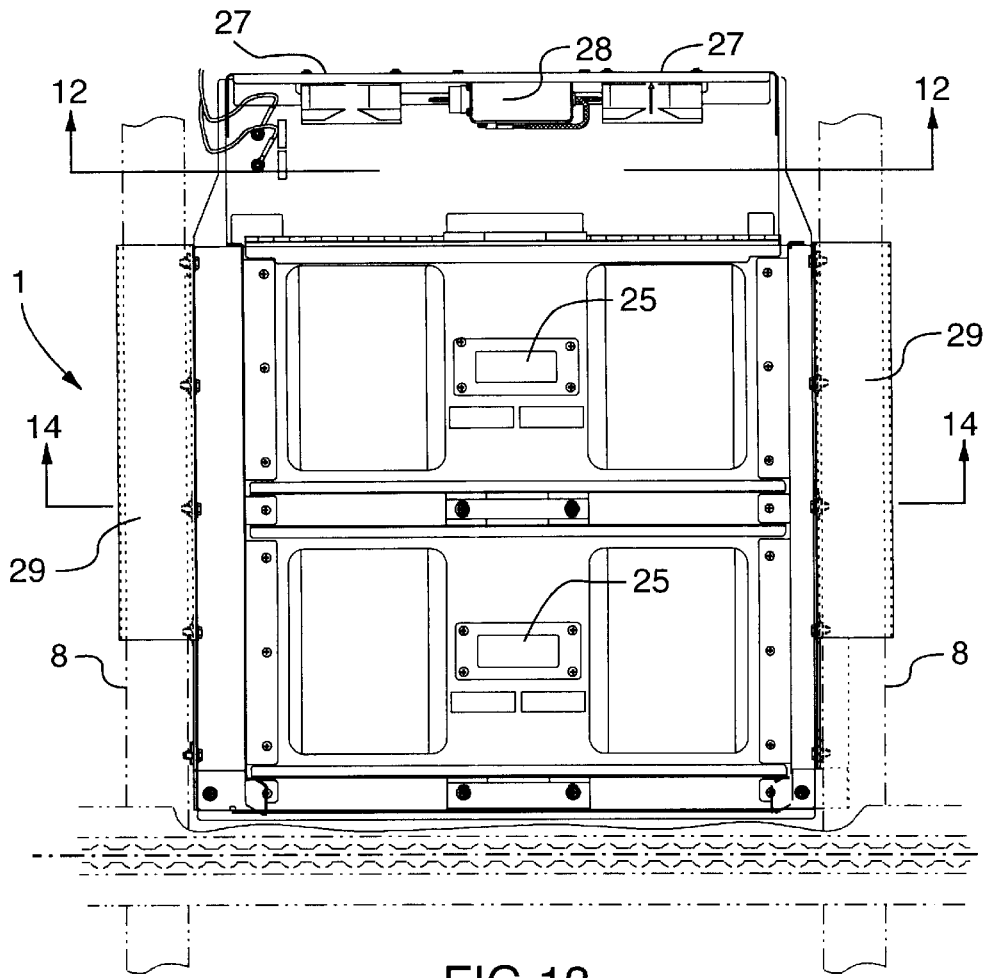
FIG. 13 is a plan view of a recessed under floor housing adapted for housing four existing system electrical boxes that have been relocated from their under seat position and showing details of the transverse beams on which the housing is suspended adjacent a seat track.
Figure 14:
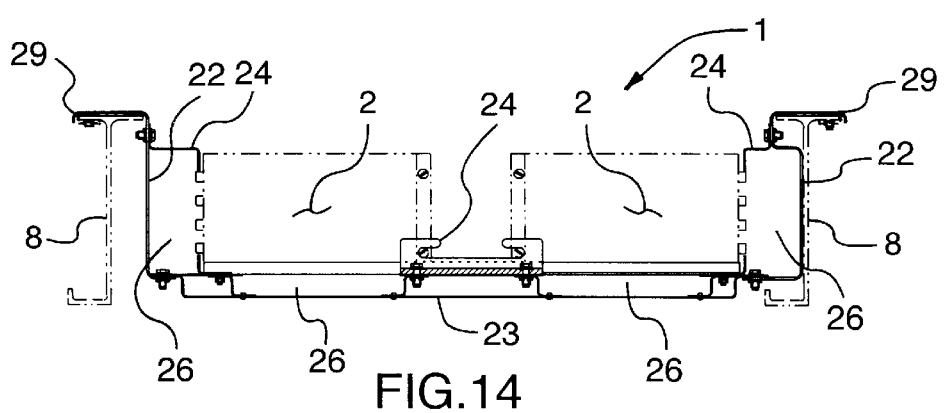
FIG. 14 is a sectional view along line 14—14 of FIG. 13 showing mounting brackets used to mount the four individual system electrical boxes with a positive and sure connection shown in dashed outline and to show the provision of air flow channels around the system electrical boxes in line with the air output from the axial flow fans.

FIGS. 12, 13 and 14 show the details of the under floor recessed housing 1 that is suspended on brackets 29 from the adjacent floor beams 8 once the existing floor panels 12 have been removed from the cabin floor 4. The housing 1 is recessed beneath the floor 4 surface adjacent to the passenger seat 5. Each housing in the embodiment illustrated can accommodate up to four individual system electrical boxes 2 relocated from under the passenger seats 5 into the recessed housing 1. It will be understood that larger housings 1 may be included depending on the aircraft type and seat arrangement that can store six or eight individual boxes 2 or larger equipment for serving multiple passenger seats. Each housing 1 has a removable top cover 14 and cover frame 15 installed above after the suspended sheet metal tray portion (shown in FIGS. 13 and 14) is installed. The tray portion includes side walls 22 and bottom wall 23 that define an interior compartment with the underside of the cover 14.

Releasable mounting brackets 24, including release latch 25, secure the electronic units 2 to the housing 1, as best shown in FIG. 14. The mounting brackets 24 and 25 support the electronic units 2, a predetermined distance from the top cover 14 bottom wall 23 and side walls 22 thereby defining one way airflow channels 26 aligned with the fans 27 to conduct a cooling flow of air through the housing compartment 1 and a sure positive electrical connection. The fans 27 intake air flow that has exited from the passenger cabin 3 (as indicated with arrows in FIG. 1) through side wall air louvers directing air into the under floor compartment. Air from the fans 27 continues the flow pattern of the passenger cabin air circulation system and is not directed into the passenger cabin 3, but continues with the spent airflow to be exhausted or mixed with fresh intake air from the engine compressors after filtering and heat exchange.

The housing 1 includes a temperature and fan rotation sensor 28 that is also in communication with the master control for the electronic units 2. Cabin crew is alerted by means of alarms or a display when there is a fan malfunction (where a fan ceases to rotate) or when the temperature in the housing 1 exceeds the desired operating range. Cabin crew can operate the master control to shut down any malfunctioning or overheating electronic units 2 within the housing 1. The fans 27 are an efficient means of cooling the housings 1 with existing cool air flow however it is possible to include electrically powered air conditioning units within the housings 1 as well if necessary since space restrictions and noise control are less problematic outside the passenger cabin area.

In order to minimize power consumption and reduce noise, the fans 27 are axial flow with low noise feathered blades and are driven by 28 volt DC electrical power. Of course, due to their location underneath a sealed cover plate 14 and considering that the floor panels 12 have sound dampening capability, the minimal additional noise created by the fans 27 does not cause any noise increase in the passenger cabin 3.

As shown in FIGS. 13 and 14, the sheet metal structure of the housing 1 is easily dropped into place supported on the beams 8 from overhead on laterally extending beam flange support brackets 29. As shown in FIG. 7 the mounting bracket 29 is relatively thin sheet metal and is sandwiched between the top flange of the floor beam 8 and the bottom surface of the cover frame 15.

Figure 15:
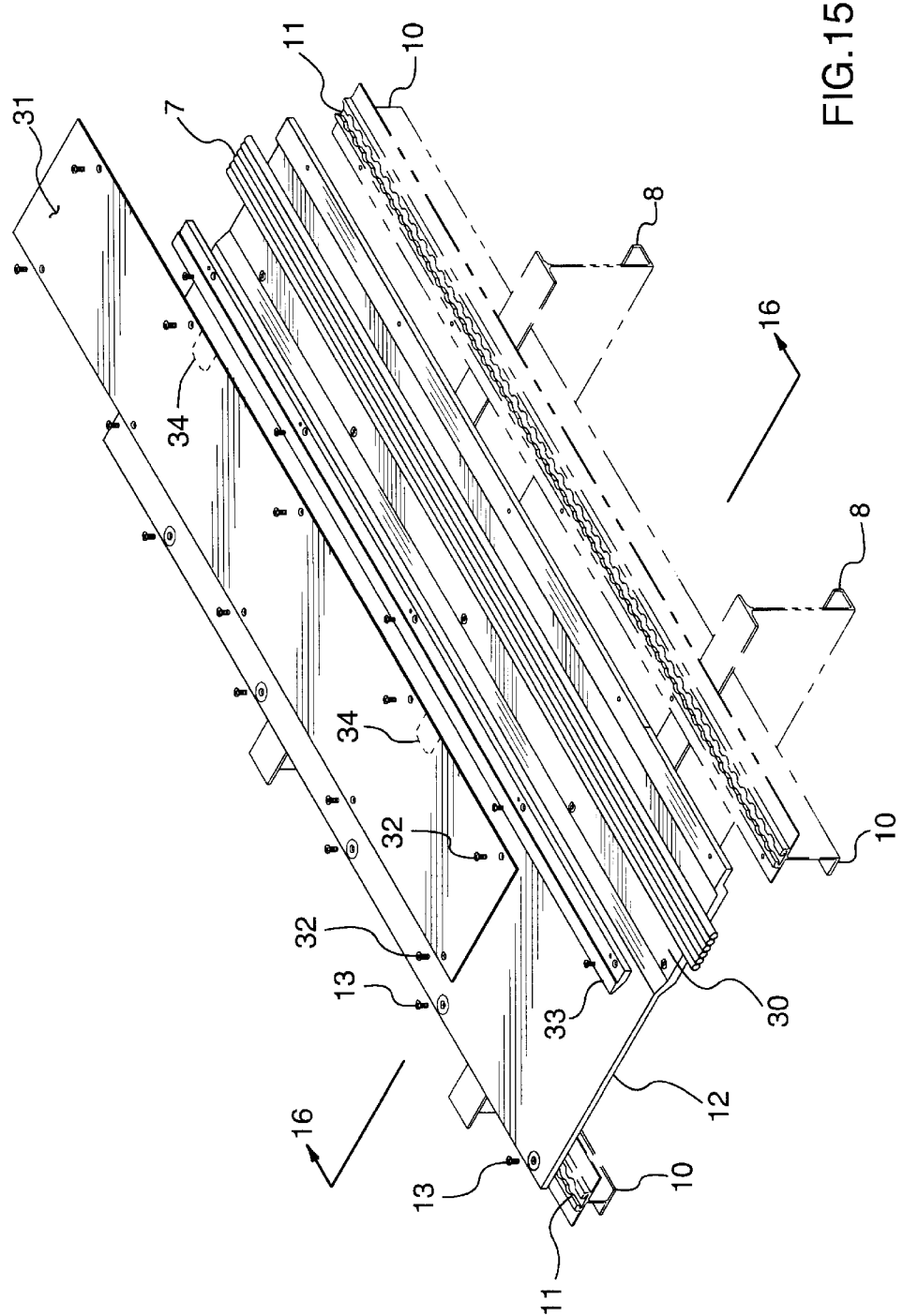
FIG. 15 is an exploded perspective view of a floor panel that includes a recessed cable raceway with removable cap plate for providing a cable raceway between the recessed housing and individual passenger seats units which are secured to the seat track.
Figure 16:
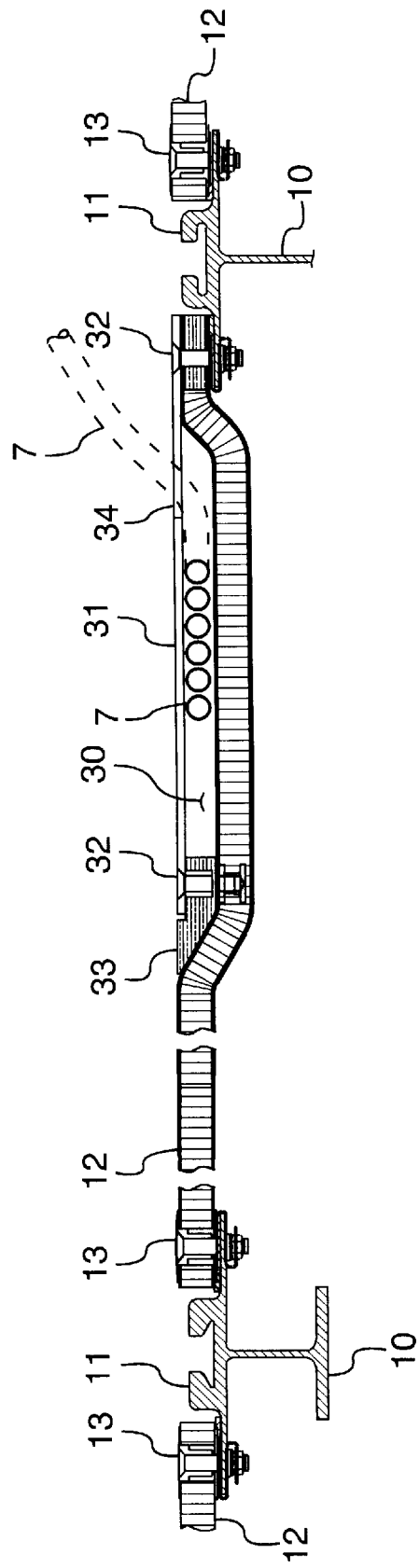
FIG. 16 is a detailed sectional view along line 16—16 of FIG. 15 showing in dashed outline the means by which the top cap plate can be notched or cut open to permit passage of cables to individual seats units at any point along the length of the raceway.

Conventionally floor mounted wires and cables are positioned inside a plastic raceway which is located under a plastic seat track cover strip (not shown) that covers the seat tracks 11 and protrudes upwardly from the carpeted cabin floor surface. As shown in FIGS. 15 and 16, the invention preferably includes modified floor panels 12 that have a recessed conduit raceway 30 disposed adjacent to the seat track 11. A removable cap plate 31 is secured with bolts 32 and a filler strip 33. As best seen in FIG. 16, the cap plate 31 and adjacent floor panels 12 have flush top surfaces thereby avoiding the discontinuous surface common in conventional aircraft cabin floors. Carpet may be applied over the floor panels 12, cap plate 31 and if desired over open portions of the seat track 11 to provide a completely flat continuous floor surface without obstruction or visual discontinuity.

As indicated in FIG. 5, cables 7 extend from the individual electronic units 2 to each passenger seat 5. In order to pass from the recessed raceway 30 to the passenger seat 5 mounted with legs in the seat track 11, the cap plate 31 includes a lateral opening 34. The opening 34 can be cut easily in the thin sheet metal cap plate 31 with a jigsaw or pre-punched knock out openings or notches 34 can be provided. Since the cap plate 31 is a simple flat plate with drilled holes, it can be treated as a recyclable item that can be replaced if the seat pitch on the aircraft is repeatedly changed and numerous openings 34 are made in the cap plate 31.

Figure 17:
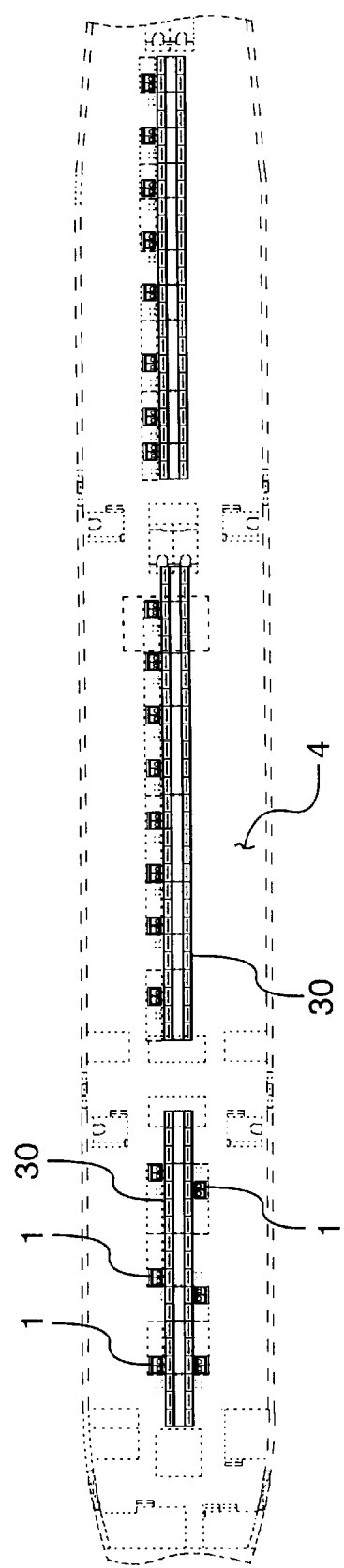

It will be appreciated that the invention can be adapted to various cabin floor plans or aircraft configurations. FIG. 17 demonstrates an alternative configuration showing two longitudinal raceways 30 with recessed housings 1 laterally positioned branching off from the raceways 30 with floor panels 12 within the cabin floor 4 attached to the top flanges of transverse floor beams 8 and floor joists 10 with removable bolts.

A significant advantage of the invention is that existing floor panels 12 can be removed and modified without requiring any modification to the beams 8 or joists 10. Modification to these structural components will require approval by the proper authorities. However, the invention relates to floor panels 12 that are removably attached with bolts and the strength of the floor panels 12 is maintained.

Figure 20:
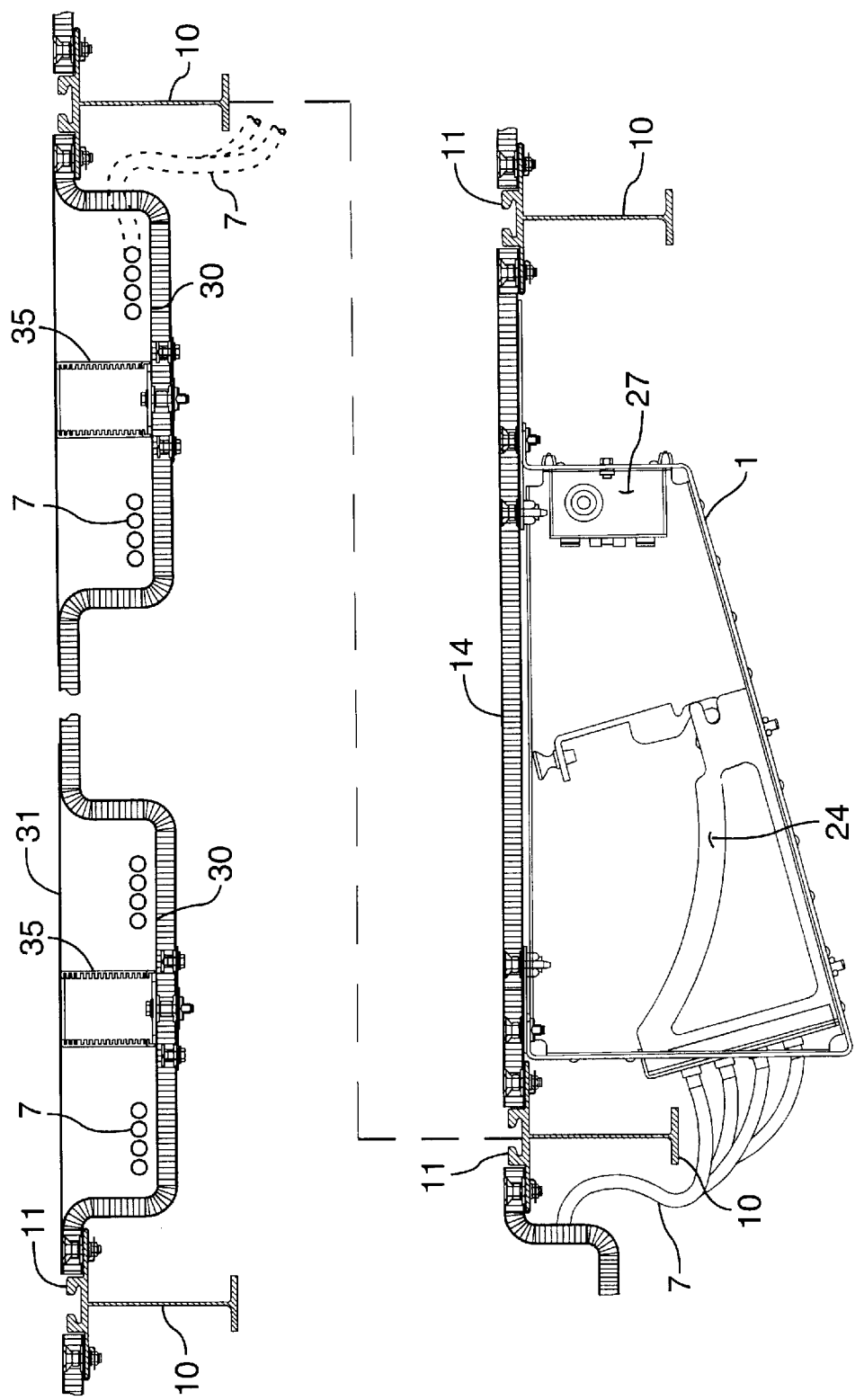
Figure 21:
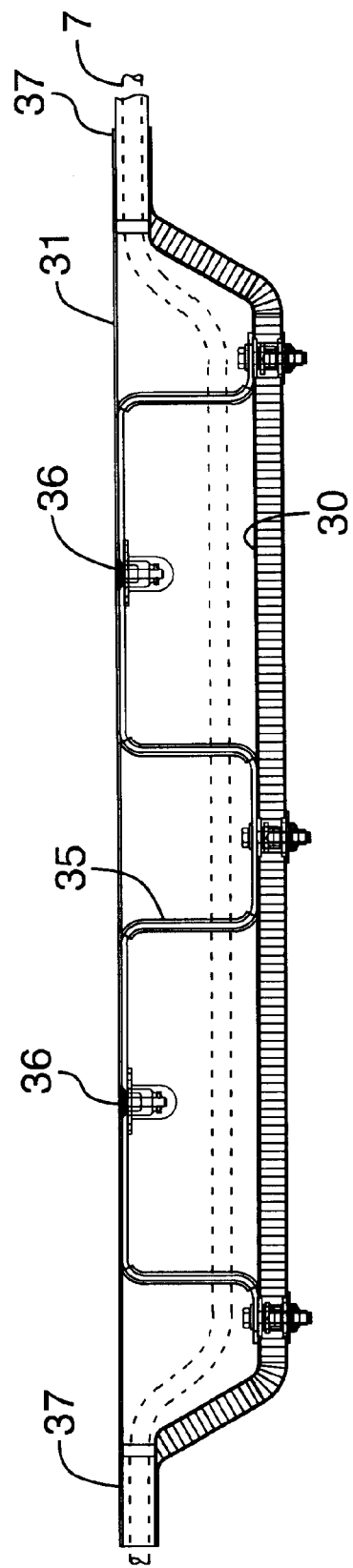
Figure 22:
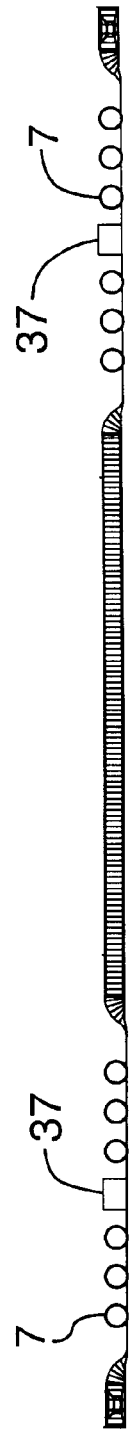

As shown in FIGS. 18 and 19, two parallel longitudinal cable raceways 30 are provided between the seat tracks 11 and serve to house the cables 7 as shown for example in FIGS. 20, 21 and 22. In the area between the floor beams 8, as shown in FIG. 19, the raceway 30 is relatively deep. In these areas, a support bracket 35, best seen in FIGS. 20 and 21, is provided to support to cap plate 31 and is attached thereto with bolts 36. In the area extending over the floor beams 8 however, the raceway 30 is significantly shallower as shown in FIG. 22, but remains sufficient for housing the cables 7 with a spacer block 37 to support the cap plate 31.

As indicated in FIG. 20, the cables 7 pass through the raceway 30 and connect laterally to the electronic units 2 (not shown) housed within the recessed housing 1 and cooled with fan 27 when mounted in mounting bracket 24.

As shown in FIG. 18 optional cutout panels 38 can be provided in a relatively low stress area of the central portion of the cap plate 31 attached with bolts 36 to provide access for routing the cables 7 to the passenger seats 5 and for providing access to the raceway 30 at periodic locations where necessary. An important feature of this alternative raceway 30 is that as shown in FIG. 22 the raceway 30 is very shallow when it passes over the floor beams 8 thereby eliminating any need to modify the floor beams 8. Further the cut out panels 38 provided in the relatively low stress central portion of the cap plate 31 maintain the diaphragm strength of the floor panel 12 which reinforces the beam 8 and joist 10 floor support structure.

Therefore, as described in detail above, the invention provides an integrated system for retrofitting existing system electrical boxes 2 from under passenger seats 5 to a recessed under floor housing 1 together with a recessed raceway 30. The invention provides a completely flat floor area and removes electronic components 2 from the passenger cabin area 3 while providing improved circulation to cool the electronic components 2 and extend their service life significantly. In addition, the recessed housing 1 and recessed raceway 30 provides improved access for maintenance and inspection as well as fan rotation and temperature sensors 28 to monitor any malfunctioning units 2.

Although the above description relates to a specific preferred embodiment as presently contemplated by the inventor, it will be understood that the invention in its broad aspect includes mechanical and functional equivalents of the elements described herein.

I claim:

1. An under floor housing system for a plurality of passenger seat electronic units within an aircraft,
   the aircraft including a passenger cabin with a floor supporting a plurality of passenger seats, the passenger cabin having an air circulation system;
   the individual passenger seat electronic units each being connected to a master control and communicating via at least one conduit to a passenger interface accessible from an associated passenger seat, the units and interface capable of providing passenger services selected from the group consisting of: audio entertainment; video entertainment; telephone; intercom; television; video games; internet; email; and electrical power supply,
   the under floor housing system comprising:
      at least one housing recessed beneath the floor surface adjacent the passenger seats, each housing having: a removable top cover; side walls; and a bottom wall defining an interior compartment.

2. An under floor housing system according to claim 1 wherein each housing includes a temperature sensor in communication with the master control.

3. An under floor housing system according to claim 1, including:
   air cooling means, for cooling each electronic unit within the interior compartment of each housing, the air cooling means comprising a fan with an intake and outlet in communication with the passenger cabin air circulation system.

4. An under floor housing system according to claim 3 wherein each housing includes a fan rotation sensor in communication with the master control.

5. An under floor housing system according to claim 3 wherein the fan is axial flow with feathered blades.

6. An under floor housing system according to claim 3 wherein the fan is axial flow with non-feathered blades.

7. An under floor housing system according to claim 3 wherein the fan is driven by 28 volt DC electric power.

8. An under floor housing system according to claim 3 wherein the fan is driven by 115 volt AC electric power.

9. An under floor housing system according to claim 3 wherein each housing includes releasable mounting brackets for mounting the passenger seat electronic units.

10. An under floor housing system according to claim 9 wherein the mounting brackets include a release latch.

11. An under floor housing system according to claim 9 wherein the mounting brackets support the electronic units a predetermined distance from the top cover, bottom and side walls thereby defining one way air flow channels aligned with the fan through the housing compartment.

12. An under floor housing system according to claim 9 wherein the mounting brackets include mating positive connectors with the electronic units.

13. An under floor housing system according to claim 1,
    wherein the aircraft cabin floor comprises: a plurality of spaced apart transverse floor beams with a top beam flange: a plurality of longitudinal joists supported by the transverse floor beams, each joist having a seat support track in a top joist flange thereof; and a plurality of floor panels mounted to at least one of the flanges;
    the side walls of the housing including a laterally extending beam flange saddle mounting bracket.

14. An under floor housing system according to claim 1 wherein the housing includes an access cover frame having peripheral plates defining a cover opening, at least one peripheral plate including a laterally extending floor panel support plate.

15. An under floor housing system according to claim 1, wherein the aircraft cabin floor comprises: a plurality of spaced apart transverse floor beams with a top beam flange: a plurality of longitudinal joists supported by the transverse floor beams, each joist having a seat support track in a top joist flange thereof; and a plurality of floor panels mounted to at least one of the flanges, and wherein the under floor housing system includes:
    a conduit raceway beneath a top surface of the floor panels and disposed adjacent a seat track, the raceway having a removable cap plate.

16. An under floor housing system according to claim 15, wherein the cap plate and adjacent floor panels have a flush top surface.

17. An under floor housing system according to claim 15 wherein the cap plate includes a conduit passage opening.

* * * * *